US010234629B2

(12) United States Patent
Huangfu

(10) Patent No.: US 10,234,629 B2
(45) Date of Patent: Mar. 19, 2019

(54) METHOD FOR REDUCING THREADING DISLOCATION OF SEMICONDUCTOR DEVICE

(71) Applicant: Huawei Technologies Co., Ltd., Shenzhen (CN)

(72) Inventor: Yourui Huangfu, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/975,496

(22) Filed: May 9, 2018

(65) Prior Publication Data

US 2018/0259708 A1 Sep. 13, 2018

Related U.S. Application Data

(60) Division of application No. 15/186,681, filed on Jun. 20, 2016, now abandoned, which is a continuation of
(Continued)

(51) Int. Cl.
*G02B 6/13* (2006.01)
*H01S 5/00* (2006.01)
(Continued)

(52) U.S. Cl.
CPC ............... *G02B 6/122* (2013.01); *G02B 6/13* (2013.01); *H01L 21/0273* (2013.01);
(Continued)

(58) Field of Classification Search
CPC ... G02B 6/122; H01S 5/02296; H01S 5/3013; H01S 5/026; H01S 5/323; H01L 21/308;
(Continued)

(56) References Cited

U.S. PATENT DOCUMENTS 4,806,996 A 2/1989 Luryi
6,306,672 B1 * 10/2001 Kim ................... B82Y 20/00
438/22
(Continued)

FOREIGN PATENT DOCUMENTS

CN 1445986 A 10/2003
CN 1983656 A 6/2007
(Continued)

OTHER PUBLICATIONS

Machine Translation and Abstract of Chinese Publication No. CN102332423, Jan. 25, 2012, 11 pages.
(Continued)

*Primary Examiner* — Akm E Ullah
(74) *Attorney, Agent, or Firm* — Conley Rose, P.C.

(57) ABSTRACT

A semiconductor device and a method for producing a semiconductor device are disclosed. The semiconductor device includes a first silicon layer; a first dielectric layer, located on the first silicon layer, where the first dielectric layer includes a window, and a bottom horizontal size of the window of the first dielectric layer is not greater than 20 nm; and a III-V semiconductor layer, located on the first dielectric layer and in the window of the first dielectric layer, and connected to the first silicon layer in the window of the first dielectric layer. A III-V semiconductor material of the semiconductor device has no threading dislocations, and therefore has relatively high performance.

7 Claims, 10 Drawing Sheets

Related U.S. Application Data application No. PCT/CN2013/090099, filed on Dec. 20, 2013.

(51) Int. Cl.

| | | |
|---|---|---|
| *H01L 33/00* | (2010.01) | |
| *G02B 6/12* | (2006.01) | |
| *G02B 6/122* | (2006.01) | |
| *H01L 21/02* | (2006.01) | |
| *H01L 21/027* | (2006.01) | |
| *H01L 21/308* | (2006.01) | |
| *H01L 21/311* | (2006.01) | |
| *H01L 21/762* | (2006.01) | |
| *H01L 29/20* | (2006.01) | |
| *H01L 29/78* | (2006.01) | |
| *H01L 31/0232* | (2014.01) | |
| *H01L 31/103* | (2006.01) | |
| *H01S 5/022* | (2006.01) | |
| *H01S 5/026* | (2006.01) | |
| *H01S 5/30* | (2006.01) | |
| *H01S 5/323* | (2006.01) | |
| *H01S 5/02* | (2006.01) | |

(52) U.S. Cl.
CPC .. *H01L 21/02381* (2013.01); *H01L 21/02538* (2013.01); *H01L 21/02636* (2013.01); *H01L 21/02639* (2013.01); *H01L 21/308* (2013.01); *H01L 21/31144* (2013.01); *H01L 21/7624* (2013.01); *H01L 29/20* (2013.01); *H01L 29/78* (2013.01); *H01L 31/02325* (2013.01); *H01L 31/1035* (2013.01); *H01L 33/00* (2013.01); *H01S 5/021* (2013.01); *H01S 5/026* (2013.01); *H01S 5/0218* (2013.01); *H01S 5/02296* (2013.01); *H01S 5/3013* (2013.01); *H01S 5/323* (2013.01); *G02B 2006/12123* (2013.01); *H01L 21/02488* (2013.01); *H01L 21/02494* (2013.01); *H01S 5/00* (2013.01)

(58) Field of Classification Search
CPC ......... H01L 21/31144; H01L 21/02538; H01L 21/02636; H01L 29/20; H01L 31/1035; H01L 31/02325

See application file for complete search history.

(56) References Cited

U.S. PATENT DOCUMENTS

| | | | | |
|---|---|---|---|---|
| 6,461,935 B2* | 10/2002 | Miyamoto | ........ | H01L 21/76264 257/510 |
| 6,730,588 B1* | 5/2004 | Schinella | ............ | H01L 21/2807 257/E21.201 |
| 7,029,959 B1* | 4/2006 | Yang | ................. | H01L 29/66795 257/E21.444 |
| 7,297,625 B2 | 11/2007 | Nakahata et al. | | |
| 7,309,880 B2 | 12/2007 | Terashita | | |
| 7,638,842 B2 | 12/2009 | Currie et al. | | |
| 7,812,357 B2* | 10/2010 | Kim | ................... | H01L 33/0079 257/79 |
| 7,893,798 B2* | 2/2011 | Foster | ................. | B81C 1/00333 200/181 |
| 8,502,263 B2 | 8/2013 | Li et al. | | |
| 9,704,958 B1* | 7/2017 | Cheng | ................. | H01L 29/2003 |
| 9,837,302 B1* | 12/2017 | Goktepeli | ......... | H01L 21/76256 |
| 10,090,409 B2* | 10/2018 | McGregor | .......... | H01L 29/1095 |
| 2008/0153267 A1 | 6/2008 | Clavelier et al. | | |
| 2008/0187018 A1* | 8/2008 | Li | .................... | H01L 21/02381 372/50.11 |
| 2011/0084308 A1* | 4/2011 | Loh | .................. | H01L 21/02381 257/190 |
| 2012/0028444 A1* | 2/2012 | Vellianitis | ......... | H01L 21/02381 438/478 |
| 2012/0270378 A1 | 10/2012 | Kittler et al. | | |
| 2015/0262818 A1* | 9/2015 | Cheng | ............... | H01L 21/02488 257/615 |

FOREIGN PATENT DOCUMENTS

| | | |
|---|---|---|
| CN | 101071794 A | 11/2007 |
| CN | 102332423 A | 1/2012 |
| CN | 103390698 A | 11/2013 |
| EP | 1522612 A1 | 4/2005 |
| JP | H10170773 A | 6/1998 |
| JP | H1197796 A | 4/1999 |
| JP | 2008166776 A | 7/2008 |
| JP | 2010536170 A | 11/2010 |
| KR | 20060077807 A | 7/2006 |

OTHER PUBLICATIONS

Machine Translation and Abstract of Chinese Publication No. CN103390698, Nov. 13, 2013, 8 pages.

Machine Translation and Abstract of Japanese Publication No. JPH10170773, Jun. 26, 1998, 15 pages.

Machine Translation and Abstract of Korean Publication No. KR20060077807, Jul. 5, 2006, 5 pages.

Huangfu, Y., et al., "Heteroepitaxy of Ge on Si(001) with pits and windows transferred from free-standing porous alumina mask," IOP Publishing, Nanotechnology 24 (2013) 185302, Apr. 11, 2013, 8 pages.

Tomioka, K, et al., "III-V Nanowires on Si Substrate: Selective-Area Growth and Device Applications," XP11386487, IEEE Journal of Selected Topics in Quantum Electronics, vol. 17, No. 4, Jul. 1, 2011, pp. 1112-1129.

Foreign Communication From a Counterpart Application, Chinese Application No. 2013800040303, Chinese Search Report dated Feb. 21, 2017, 2 pages.

Foreign Communication From a Counterpart Application, Chinese Application No. 201380004030.3, Chinese Office Action dated Mar. 1, 2017, 4 pages.

Foreign Communication From a Counterpart Application, Korean Application No. 10-2016-7017473, Korean Office Action dated Mar. 22, 2018, 8 pages.

Foreign Communication From a Counterpart Application, Korean Application No. 10-2016-7017473, English Translation of Korean Office Action dated Mar. 22, 2018, 6 pages.

Foreign Communication From a Counterpart Application, Japanese Application No. 2016-541187, Japanese Office Action dated Sep. 12, 2017, 5 pages.

Foreign Communication From a Counterpart Application, Japanese Application No. 2016-541187, English Translation of Japanese Office Action dated Sep. 12, 2017, 5 pages.

Foreign Communication From a Counterpart Application, European Application No. 13899857.0, Extended European Search Report dated Dec. 9, 2016, 7 pages.

Foreign Communication From a Counterpart Application, PCT Application No. PCT/CN2013/090099, English Translation of International Search Report dated Sep. 17, 2014, 2 pages.

Foreign Communication From a Counterpart Application, PCT Application No. PCT/CN2013/090099, English Translation of Written Opinion dated Sep. 17, 2014, 5 pages.

Foreign Communication From a Counterpart Application, European Application No. 18160118.8, Extended European Search Report dated Dec. 13, 2018, 7 pages.

\* cited by examiner

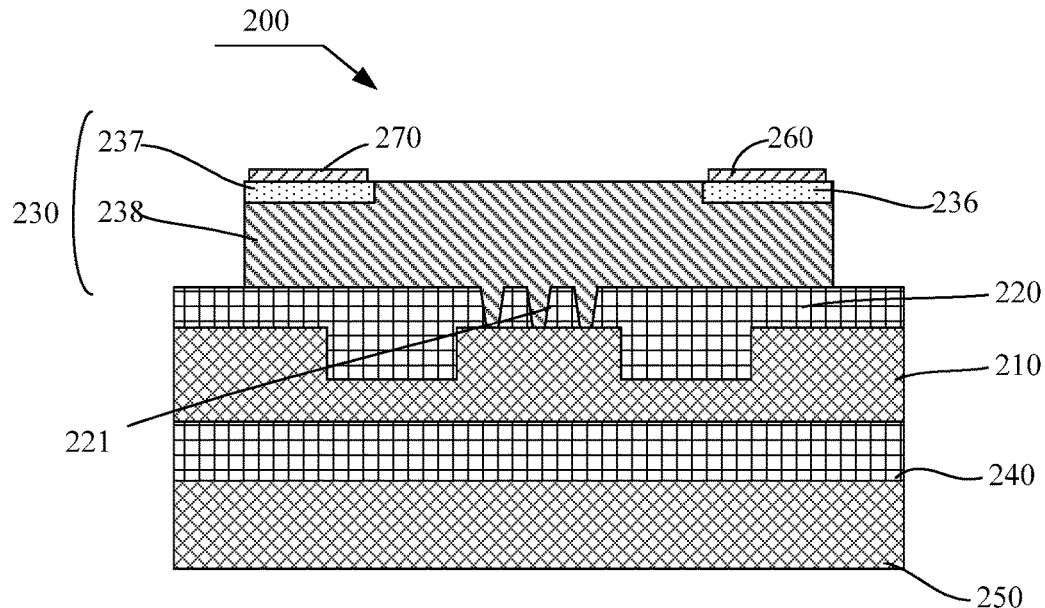

| Etch a silicon layer of SOI by using a patterned template as a mask, where the SOI includes a silicon substrate, a dielectric layer on the silicon substrate, and the silicon layer on the dielectric layer; and when the dielectric layer is exposed, stop the etching and remove the patterned template, so that the silicon layer has a window | S310 |

↓

| Etch the dielectric layer by using the silicon layer having the window as a template, and when the silicon substrate is exposed, stop the etching and remove the silicon layer having the window, so that the dielectric layer has a window, where a bottom horizontal size of the window of the dielectric layer is not greater than 20 nm | S320 |

↓

| Grow a semiconductor material in the window of the dielectric layer to form a buffer layer, and continue to grow the semiconductor material on the buffer layer to obtain a semiconductor layer | S330 |

METHOD FOR REDUCING THREADING DISLOCATION OF SEMICONDUCTOR DEVICE

CROSS-REFERENCE TO RELATED APPLICATIONS

This application is a divisional application of U.S. patent application Ser. No. 15/186,681, filed on Jun. 20, 2016, which is a continuation of International Application No. PCT/CN2013/090099, filed on Dec. 20, 2013, both of which are hereby incorporated by reference in their entireties.

TECHNICAL FIELD

The present disclosure relates to the field of information technologies, and in particular, to a semiconductor device and a method for producing a semiconductor device.

BACKGROUND

To improve performance of a microprocessor, an integrated circuit always keeps high-speed development of miniaturization and diversification. However, a reduction in device size and an increase in device density also cause some inevitable problems, for example, a signal delay and interconnect crosstalk. Due to high power consumption and a waste of energy caused by usage of an electrical interconnection medium, a requirement of high performance and low costs for a device in the semiconductor industry gradually cannot be met. It is found that optical interconnection can effectively resolve these problems and bring about many new functions to a conventional integrated circuit. Therefore, silicon photonics becomes an important research subject of a future optoelectronic integrated circuit.

Silicon is a foundation stone of a microelectronic platform, is also indispensable for optoelectronic integration, and has advantages of high integration and low costs. Oxides of the silicon are excellent insulating materials, have a relatively high refractive-index difference, and may be used to guide light. However, the silicon is an indirect bandgap semiconductor and has very low efficiency in light absorption and emission; in addition, carrier mobility of the silicon is not high, leading to limitations to an application involving a high speed. On the contrary, a III-V compound semiconductor has a direct bandgap structure and high electron mobility, and a low dimensional system of the III-V compound semiconductor, for example, a multi-quantum well or a quantum dot, brings about much excellent performance to an optical gain, and brings about diverse changes to a device performance parameter by means of adjustment on material composition and optimization on a low dimensional structure. The III-V compound semiconductor may be used to produce a optoelectronic device such as a laser or a solar cell, and an electronic device, such as a high electron mobility transistor.

A monolithic integration technology for producing a III-V semiconductor device is epitaxially growing a III-V material on a silicon substrate, to produce a device. However, because there are significant lattice mismatch and thermal mismatch between the silicon and a III-V material such as gallium arsenide or indium phosphide, directly growing the III-V material on the silicon leads to high-density threading dislocations, causing a degradation of device performance and a reduction in reliability.

SUMMARY

Embodiments of the present disclosure provide a semiconductor device and a method for producing a semiconductor device, which can provide a III-V semiconductor device without a threading dislocation.

According to a first aspect, a semiconductor device is provided, including a first silicon layer; a first dielectric layer, where the first dielectric layer is located on the first silicon layer, the first dielectric layer has a window, and a bottom horizontal size of the window of the first dielectric layer is not greater than 20 nanometer (nm); and a III-V semiconductor layer, where the III-V semiconductor layer is distributed on the first dielectric layer, goes deeply into the window of the first dielectric layer, and is connected to the first silicon layer in the window of the first dielectric layer.

With reference to the first aspect, in a first possible implementation manner, the window of the first dielectric layer is in a shape of an inverted taper or of a cylinder.

With reference to the first aspect or the first possible implementation manner of the first aspect, in a second possible implementation manner, the first silicon layer is a silicon substrate; and the semiconductor device further includes a second silicon layer, where the second silicon layer includes a waveguide, the second silicon layer is located on the first dielectric layer, a part, between the second silicon layer and the first silicon layer, of the first dielectric layer has no window, and the second silicon layer is directly or indirectly connected to the III-V semiconductor layer.

With reference to the first aspect or the first possible implementation manner of the first aspect, in a third possible implementation manner, the first silicon layer includes a waveguide, where the window of the first dielectric layer is located on the waveguide; and the semiconductor device further includes a second dielectric layer and a third silicon layer, where the third silicon layer is a silicon substrate, and the second dielectric layer is located under the first silicon layer and on the third silicon layer.

With reference to the first aspect or any possible implementation manner of the first to third possible implementation manners of the first aspect, in a fourth possible implementation manner, the semiconductor device is a laser; the III-V semiconductor layer includes a buffer layer, an active region, an interlayer, an N-type doped transition layer, and a P-type doped transition layer; and the semiconductor device further includes an N electrode and a P electrode, where the N electrode is connected to the N-type doped transition layer, and the P electrode is connected to the P-type doped transition layer.

With reference to the first aspect or any possible implementation manner of the first to third possible implementation manners of the first aspect, in a fifth possible implementation manner, the semiconductor device is an optical amplifier; the III-V semiconductor layer includes a buffer layer, an active region, an interlayer, an N-type doped transition layer, and a P-type doped transition layer; and the semiconductor device further includes an N electrode, a P electrode, and an antireflective film, where the N electrode is connected to the N-type doped transition layer, the P electrode is connected to the P-type doped transition layer, and the antireflective film is located on an end face of the III-V semiconductor layer.

With reference to the first aspect or any possible implementation manner of the first to third possible implementation manners of the first aspect, in a sixth possible implementation manner, the semiconductor device is a photodetector; the III-V semiconductor layer includes an N region, a P region, and an intrinsic region; and the semiconductor device further includes an N electrode and a P electrode, where the N electrode is connected to the N region, and the P electrode is connected to the P region.

With reference to the first aspect or the first possible implementation manner of the first aspect, in a seventh possible implementation manner, the semiconductor device is a transistor; the III-V semiconductor layer is a channel material of the transistor; and the semiconductor device further includes a source, a drain, a gate, and a gate dielectric layer, where the source, the drain, and the gate dielectric layer are connected to the III-V semiconductor layer, and the gate is connected to the gate dielectric layer.

According to a second aspect, a method for producing a semiconductor device is provided, including etching a silicon layer of silicon on insulator (SOI) using a patterned template as a mask, where the SOI includes a silicon substrate, a dielectric layer on the silicon substrate, and the silicon layer on the dielectric layer; and when the dielectric layer is exposed, stopping the etching and removing the patterned template so that the silicon layer has a window; etching the dielectric layer using the silicon layer having the window as a template, and when the silicon substrate is exposed, stopping the etching and removing the silicon layer having the window so that the dielectric layer has a window, where a bottom horizontal size of the window of the dielectric layer is not greater than 20 nm; and growing a semiconductor material in the window of the dielectric layer to form a buffer layer, and continuing to grow the semiconductor material on the buffer layer to obtain a semiconductor layer.

With reference to the second aspect, in a first possible implementation manner, the patterned template is a porous alumina membrane or a photoresist after exposure to extreme ultraviolet and development.

With reference to the second aspect or the first possible implementation manner of the second aspect, in a second possible implementation manner, the semiconductor material is a III-V semiconductor material.

With reference to the second aspect or the first or second possible implementation manner of the second aspect, in a third possible implementation manner, the semiconductor material includes a preset quantity of doped materials.

With reference to the second aspect or any possible implementation manner of the first to third possible implementation manners of the second aspect, in a fourth possible implementation manner, before the etching a silicon layer of SOI using a patterned template as a mask, the method further includes sheltering a partial region of the patterned template using a photoresist so that the silicon layer under the sheltered region is not etched.

With reference to the fourth possible implementation manner of the second aspect, in a fifth possible implementation manner, the method further includes producing a waveguide in the silicon layer that is not etched.

According to a third aspect, a method for producing a semiconductor device is provided, including producing a waveguide in a silicon layer of SOI, where the SOI includes a silicon substrate, a first dielectric layer on the silicon substrate, and the silicon layer on the first dielectric layer; forming a second dielectric layer on the silicon layer; etching the second dielectric layer using a patterned template as a mask, and when the silicon layer is exposed, stopping the etching and removing the patterned template so that the second dielectric layer has a window, where a bottom horizontal size of the window of the second dielectric layer is not greater than 20 nm; and growing a semiconductor material in the window of the second dielectric layer to form a buffer layer, and continuing to grow the semiconductor material on the buffer layer to obtain a semiconductor layer.

With reference to the third aspect, in a first possible implementation manner, the patterned template is a porous alumina membrane or a photoresist after exposure to extreme ultraviolet and development.

With reference to the third aspect or the first possible implementation manner of the third aspect, in a second possible implementation manner, the semiconductor material is a III-V semiconductor material.

With reference to the third aspect or the first or second possible implementation manner of the third aspect, in a third possible implementation manner, the semiconductor material includes a preset quantity of doped materials.

With reference to the third aspect or any possible implementation manner of the first to third possible implementation manners of the third aspect, in a fourth possible implementation manner, the producing a waveguide in a silicon layer of SOI includes producing a ridge waveguide in the silicon layer.

With reference to the fourth possible implementation manner of the third aspect, in a fifth possible implementation manner, before the etching the second dielectric layer using a patterned template as a mask, the method further includes sheltering a partial region of the patterned template using a photoresist, where a region that is not sheltered by the photoresist corresponds to a position of the ridge waveguide.

Based on the foregoing technical solutions, for the semiconductor device in the embodiments of the present disclosure, a III-V semiconductor material is used, and the III-V semiconductor material of the semiconductor device in the embodiments of the present disclosure has no threading dislocations; therefore, the semiconductor device has relatively high performance.

BRIEF DESCRIPTION OF DRAWINGS

The following briefly describes the accompanying drawings required for describing the embodiments of the present disclosure.

FIG. 13 is a schematic structural diagram of a detector according to another embodiment of the present disclosure;

FIG. 14 is a schematic flowchart of a method for producing a semiconductor device according to an embodiment of the present disclosure;

DESCRIPTION OF EMBODIMENTS

The following describes the technical solutions in the embodiments of the present disclosure with reference to the accompanying drawings in the embodiments of the present disclosure.

It should be understood that the terms "first" and "second" in the embodiments of the present disclosure are only used to distinguish different content, and no other limitation is set to the embodiments of the present disclosure.

Figure 1:
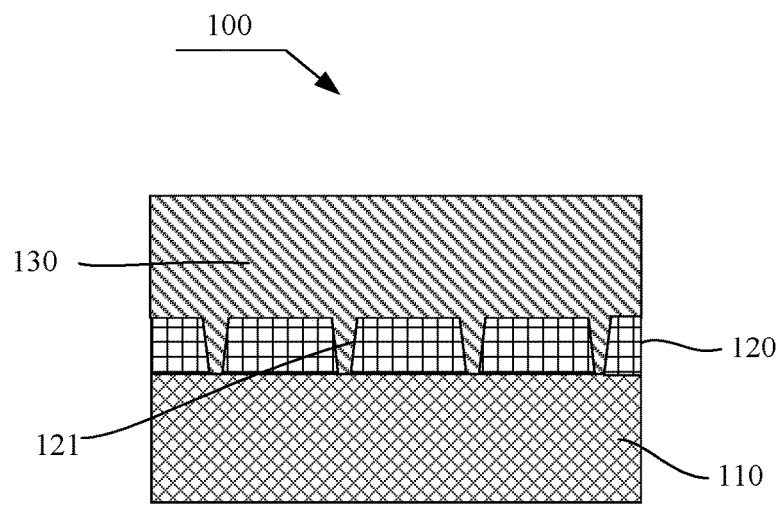
FIG. 1 is a schematic structural diagram of a semiconductor device according to an embodiment of the present disclosure.

FIG. 1 is a schematic structural diagram of a semiconductor device 100 according to an embodiment of the present disclosure. As shown in FIG. 1, the semiconductor device 100 includes a first silicon layer 110, a first dielectric layer 120, and a III-V semiconductor layer 130.

The first silicon layer 110 is a silicon substrate.

The first dielectric layer 120 is located on the first silicon layer 110. A material of the first dielectric layer 120 may be silicon oxide, or silicon nitride, or a mixture thereof.

The first dielectric layer 120 has a window 121, and a bottom horizontal size of the window 121 is not greater than 20 nm. A quantity of windows 121 is not limited, and may change according to a size of the semiconductor device 100.

The III-V semiconductor layer 130 is distributed on the first dielectric layer 120 and goes deeply into the window 121 of the first dielectric layer 120. The III-V semiconductor layer 130 is connected to the first silicon layer 110 in the window 121 of the first dielectric layer 120.

The III-V semiconductor layer 130 may be obtained by first growing a III-V semiconductor material in the window 121 and then continuing to grow the III-V semiconductor material on the first dielectric layer 120. The III-V semiconductor material may include one or more of the following: aluminium phosphide (AlP), gallium phosphide (GaP), indium phosphide (InP), aluminium arsenide (AlAs), gallium arsenide (GaAs), indium arsenide (InAs), aluminium antimonide (AlSb), gallium antimonide (GaSb), indium antimonide (InSb), aluminium nitride (AlN), gallium nitride (GaN), indium nitride (InN), and ternary and quaternary compounds thereof.

In this embodiment of the present disclosure, the bottom horizontal size of the window 121 of the first dielectric layer 120 is not greater than 20 nm, that is, a size of a contact surface between the III-V semiconductor layer 130 and the first silicon layer 110 is not greater than 20 nm in any direction; in this way, the III-V semiconductor material in the window 121 (this means, the III-V semiconductor material on the contact surface) has no threading dislocations. That is, the semiconductor device in this embodiment of the present disclosure is a III-V semiconductor device without a threading dislocation. Because the III-V semiconductor material has a direct bandgap structure and relatively high electron mobility, which can improve performance of the semiconductor device, the semiconductor device in this embodiment of the present disclosure has relatively high crystalline quality and device performance.

Therefore, for the semiconductor device in this embodiment of the present disclosure, a III-V semiconductor material is used; the III-V semiconductor material has no threading dislocations, and therefore has relatively high performance.

In this embodiment of the present disclosure, optionally, the window 121 of the first dielectric layer 120 may be in a shape of an inverted taper or of a cylinder. In other words, in this embodiment of the present disclosure, only the bottom horizontal size of the window 121 is limited to be not greater than 20 nm, but a shape of the window 121 is not limited, that is, the window 121 may also be in another shape. Furthermore, when the window 121 is in a shape of an inverted taper or of a cylinder, a bottom diameter of the window 121 is not greater than 20 nm; when the window 121 is in another shape, the bottom horizontal size of the window 121 is not greater than 20 nm.

Figure 2:
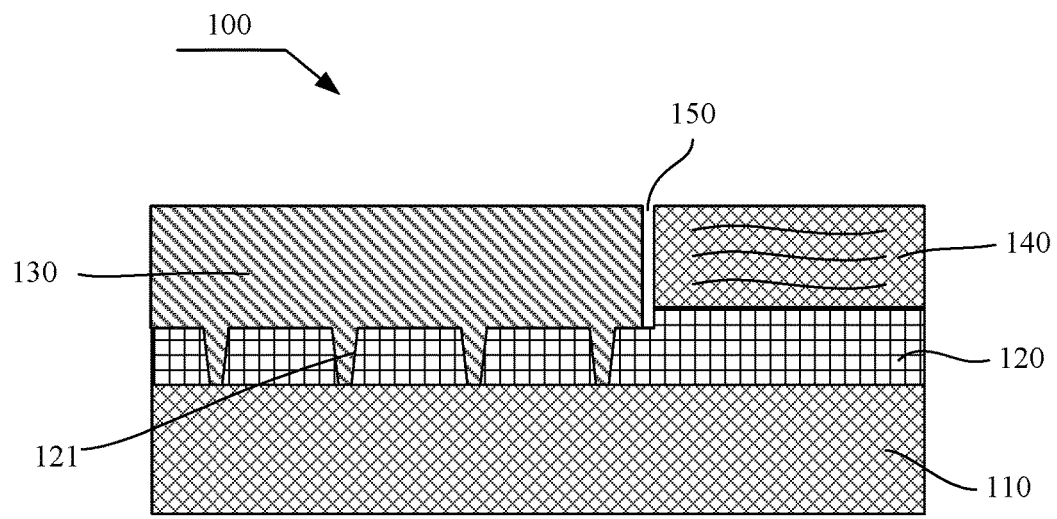
FIG. 2 is a schematic structural diagram of a semiconductor device according to another embodiment of the present disclosure.

In this embodiment of the present disclosure, optionally, as shown in FIG. 2, the semiconductor device 100 further includes a second silicon layer 140.

The second silicon layer 140 is located on the first dielectric layer 120, and a part, between the second silicon layer 140 and the first silicon layer 110, of the first dielectric layer 120 has no window. That is, the second silicon layer 140 is located on the part that has no window and that is of the first dielectric layer 120. The second silicon layer 140 is directly or indirectly connected to the III-V semiconductor layer 130. The second silicon layer 140 includes a waveguide, and light output from the III-V semiconductor layer 130 may be coupled into the waveguide.

Optionally, the semiconductor device 100 may further include a filling layer 150. The filling layer 150 is used to fill a gap between the III-V semiconductor layer 130 and the second silicon layer 140. For example, a material such as amorphous silicon may be used to fill the gap.

Optionally, the semiconductor device 100 in this embodiment of the present disclosure may be a laser, an optical amplifier, a photodetector, a transistor, a solar cell, or the like.

Figure 3:
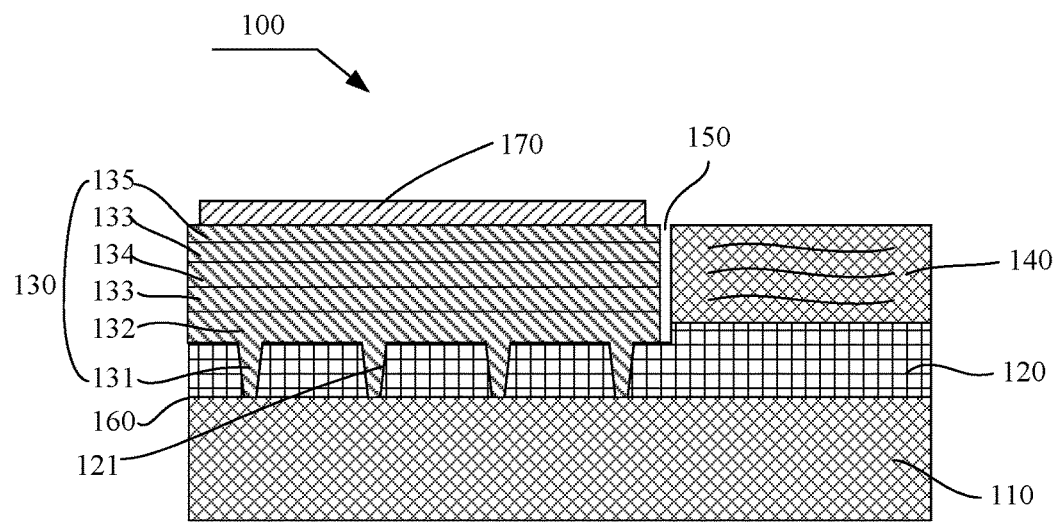
FIG. 3 is a schematic structural diagram of a laser according to an embodiment of the present disclosure.

FIG. 3 is a schematic structural diagram of a laser according to an embodiment of the present disclosure.

As shown in FIG. 3, in this embodiment, the semiconductor device 100 is a laser.

In this embodiment, the III-V semiconductor layer 130 constitutes a main structure of the laser, including a buffer layer 131, an active region 134, an interlayer 133, an N-type doped transition layer 132, and a P-type doped transition layer 135.

The III-V semiconductor material in the window 121 forms the buffer layer 131, and the semiconductor material in the buffer layer 131 has no threading dislocations.

Light of the laser is generated and amplified in the active region 134. The active region 134 may include a multi-quantum well or a quantum dot, to improve an optical gain.

In this embodiment, the semiconductor device 100 further includes an N electrode 160 and a P electrode 170, where the N electrode 160 is connected to the N-type doped transition layer 132, and the P electrode 170 is connected to the P-type doped transition layer 135. Optionally, the semiconductor device 100 may further include a grating structure.

Light output from the main structure of the laser is coupled into the waveguide in the second silicon layer 140.

For the laser in this embodiment, a III-V semiconductor material is used to form a main structure of the laser, and the III-V semiconductor material has no threading dislocations; therefore, the laser has relatively high performance.

Figure 4:
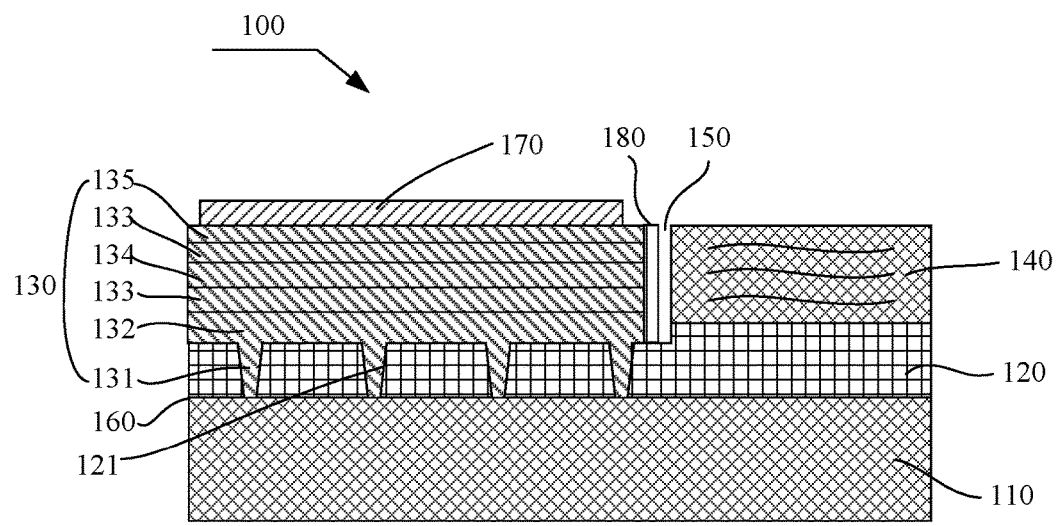
FIG. 4 is a schematic structural diagram of an optical amplifier according to an embodiment of the present disclosure.

FIG. 4 is a schematic structural diagram of an optical amplifier according to an embodiment of the present disclosure.

As shown in FIG. 4, in this embodiment, the semiconductor device 100 is an optical amplifier, which is also referred to as a semiconductor optical amplifier (SOA).

Similar to the forgoing embodiment of the laser, the III-V semiconductor layer 130 constitutes a main structure of the optical amplifier, including a buffer layer 131, an active region 134, an interlayer 133, an N-type doped transition layer 132, and a P-type doped transition layer 135.

The III-V semiconductor material in the window 121 forms the buffer layer 131, and the semiconductor material in the buffer layer 131 has no threading dislocations.

Light input into the optical amplifier from outside is amplified in the active region 134. The active region 134 may include a bulk material, a multi-quantum well, a quantum dot, a quantum wire, or the like.

In this embodiment, the semiconductor device 100 further includes an N electrode 160, a P electrode 170, and an antireflective film 180. The N electrode 160 is connected to the N-type doped transition layer 132, and the P electrode 170 is connected to the P-type doped transition layer 135. The antireflective film 180 is located on an end face of the III-V semiconductor layer 130, and the antireflective film is also referred to as an anti-reflection coating.

Light output from the main structure of the optical amplifier is coupled into the waveguide in the second silicon layer 140.

For the optical amplifier in this embodiment, a III-V semiconductor material is used to form a main structure of the optical amplifier, and the III-V semiconductor material has no threading dislocations; therefore, the optical amplifier has relatively high performance.

Figure 5:
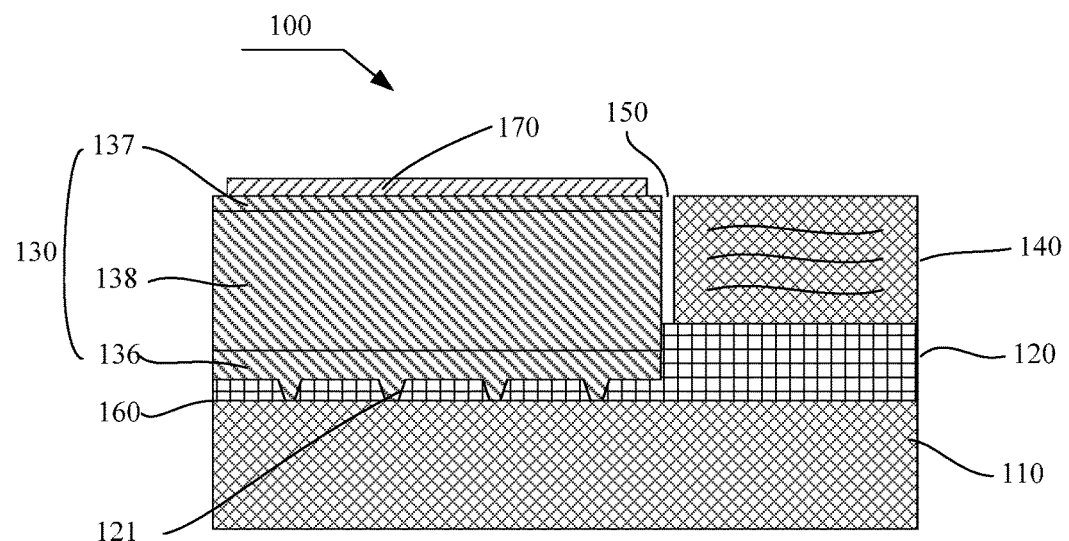
FIG. 5 is a schematic structural diagram of a detector according to an embodiment of the present disclosure.
Figure 6:
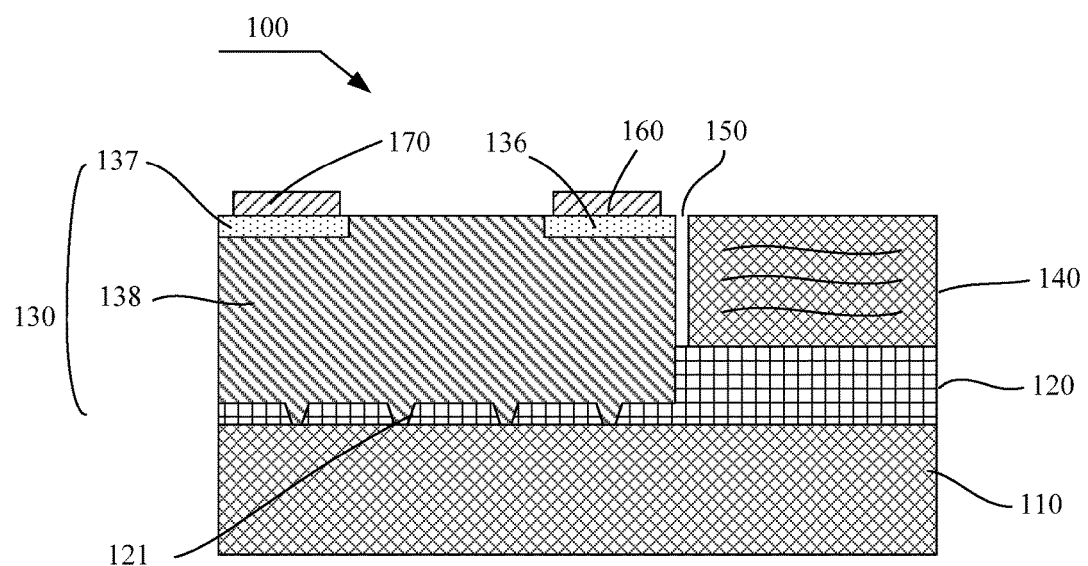
FIG. 6 is a schematic structural diagram of a detector according to another embodiment of the present disclosure.

FIG. 5 and FIG. 6 are schematic structural diagrams of a photodetector according to an embodiment of the present disclosure.

In this embodiment, the semiconductor device 100 is a photodetector.

As shown in FIG. 5 and FIG. 6, the III-V semiconductor layer 130 includes an N region 136, a P region 137, and an intrinsic region 138.

The N region 136 and the P region 137 are doped regions. The N region 136 and the P region 137 may be vertically distributed (as shown in FIG. 5), and may also be distributed on a device surface (as shown in FIG. 6).

The semiconductor device 100 further includes an N electrode 160 and a P electrode 170. The N electrode 160 is connected to the N region 136, and the P electrode 170 is connected to the P region 137.

Light is coupled into the detector from the waveguide in the second silicon layer 140 in order to be detected.

For the photodetector in this embodiment, a III-V semiconductor material is used, and the III-V semiconductor material has no threading dislocations; therefore, the photodetector has relatively high performance.

Figure 7:
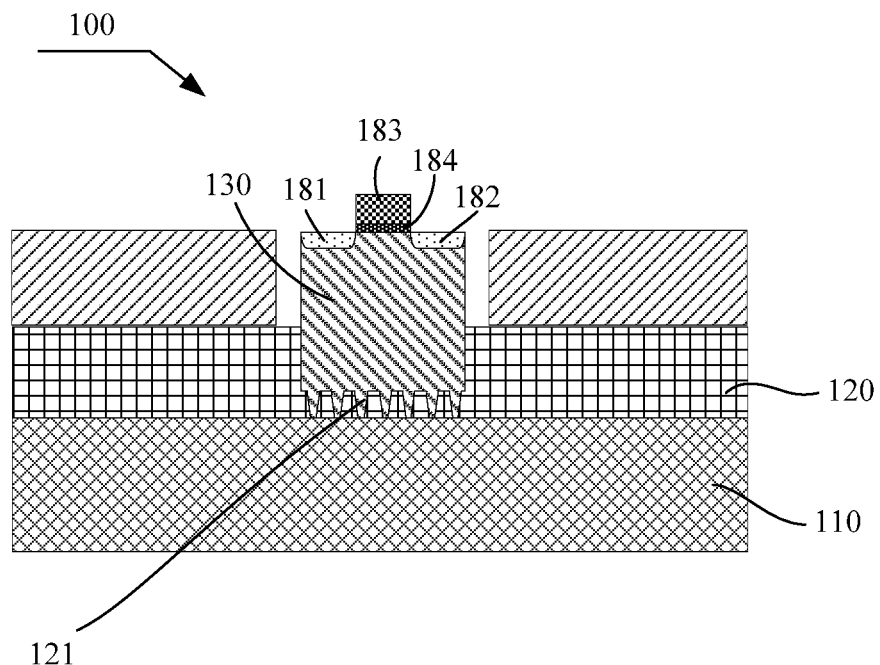
FIG. 7 is a schematic structural diagram of a transistor according to an embodiment of the present disclosure.

FIG. 7 is a schematic structural diagram of a transistor according to an embodiment of the present disclosure.

As shown in FIG. 7, in this embodiment, the semiconductor device 100 is a transistor.

The III-V semiconductor layer 130 is a channel material of the transistor, that is, the transistor in this embodiment of the present disclosure is a III-V semiconductor transistor. The channel material may include a multi-quantum well or a quantum dot.

The semiconductor device 100 further includes a source 181, a drain 182, a gate 183, and a gate dielectric layer 184. The source 181, the drain 182, and the gate dielectric layer 184 are connected to the III-V semiconductor layer 130, and the gate 183 is connected to the gate dielectric layer 184.

Figure 8:
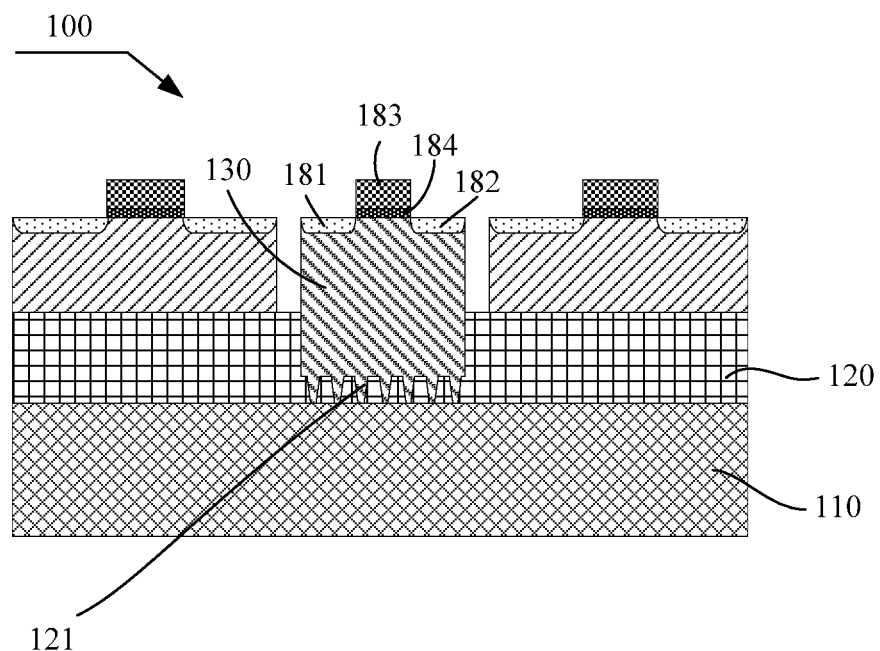
FIG. 8 is a schematic structural diagram of monolithic integration of a transistor according to an embodiment of the present disclosure.

The III-V semiconductor transistor in this embodiment of the present disclosure may be monolithically integrated with a Si transistor, as shown in FIG. 8.

Multiple transistors may be obtained by selecting different III-V semiconductor materials as channel materials. For example, a heterojunction constituted by two different bandgap materials is used as a channel material, and a high electron mobility transistor (HEMT) may be obtained. In addition, a metal-semiconductor field effect transistor (MESFET), a fin field effect transistor (FinFET), a modulation doped field effect transistor (MODFET), and the like may be further obtained.

For the transistor in this embodiment, a III-V semiconductor material is used, and the III-V semiconductor material has no threading dislocations; therefore, the transistor has relatively high performance.

Figure 9:
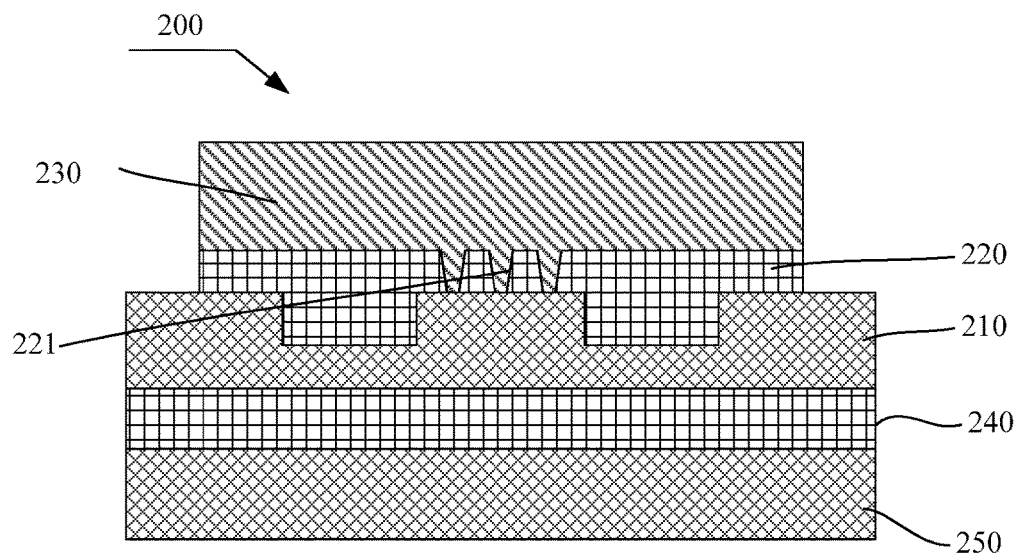
FIG. 9 is a schematic structural diagram of a semiconductor device according to another embodiment of the present disclosure.

FIG. 9 is a schematic structural diagram of a semiconductor device 200 according to another embodiment of the present disclosure. As shown in FIG. 9, the semiconductor device 200 includes a first silicon layer 210, a first dielectric layer 220, and a III-V semiconductor layer 230.

The first dielectric layer 220 is located on the first silicon layer 210. A material of the first dielectric layer 220 may be silicon oxide, or silicon nitride, or a mixture thereof.

The first dielectric layer 220 has a window 221, and a bottom horizontal size of the window 221 is not greater than 20 nm. A quantity of windows 221 is not limited, and may vary with a size of the semiconductor device 200.

The III-V semiconductor layer 230 is distributed on the first dielectric layer 220 and goes deeply into the window 221 of the first dielectric layer 220. The III-V semiconductor layer 230 is connected to the first silicon layer 210 in the window 221 of the first dielectric layer 220.

The III-V semiconductor layer 230 may be obtained by first growing a III-V semiconductor material in the window 221, and continuing to grow the III-V semiconductor material on the first dielectric layer 220. The III-V semiconductor material may include one or more of the following: aluminium phosphide (AlP), gallium phosphide (GaP), indium phosphide (InP), aluminium arsenide (AlAs), gallium arsenide (GaAs), indium arsenide (InAs), aluminium antimonide (AlSb), gallium antimonide (GaSb), indium antimonide (InSb), aluminium nitride (AlN), gallium nitride (GaN), indium nitride (InN), and ternary and quaternary compounds thereof.

In this embodiment of the present disclosure, optionally, the first silicon layer 210 includes a waveguide, for example, a ridge waveguide. The window 221 of the first dielectric layer 220 is located on the waveguide.

Optionally, the semiconductor device 200 further includes a second dielectric layer 240 and a third silicon layer 250.

The third silicon layer 250 is a silicon substrate.

The second dielectric layer 240 is located under the first silicon layer 210 and on the third silicon layer 250. A material of the second dielectric layer 240 is similar to that of the first dielectric layer 220, and may be silicon oxide, or silicon nitride, or a mixture thereof.

In this embodiment of the present disclosure, the bottom horizontal size of the window 221 of the first dielectric layer 220 is not greater than 20 nm, that is, a size of a contact surface between the III-V semiconductor layer 230 and the first silicon layer 210 is not greater than 20 nm in any direction; in this way, the III-V semiconductor material in the window 221 (this means, the III-V semiconductor material on the contact surface) has no threading dislocations. That is, the semiconductor device in this embodiment of the present disclosure is a III-V semiconductor device without a threading dislocation. Because the III-V semiconductor material has a direct bandgap structure and relatively high electron mobility, which can improve performance of the semiconductor device, the semiconductor device in this embodiment of the present disclosure has relatively high crystalline quality and device performance.

In this embodiment of the present disclosure, optionally, the window 221 of the first dielectric layer 220 may be in a shape of an inverted taper or of a cylinder. In other words, in this embodiment of the present disclosure, only the bottom horizontal size of the window 221 is limited to be not greater than 20 nm, but a shape of the window 221 is not limited, that is, the window 221 may also be in another shape. Furthermore, when the window 221 is in a shape of an inverted taper or of a cylinder, a bottom diameter of the window 221 is not greater than 20 nm; when the window 221 is in another shape, the bottom horizontal size of the window 221 is not greater than 20 nm in any direction.

Similar to the semiconductor device 100 described above, the semiconductor device 200 in this embodiment of the present disclosure may be a laser, an optical amplifier, a photodetector, a transistor, a solar cell, or the like.

Figure 10:
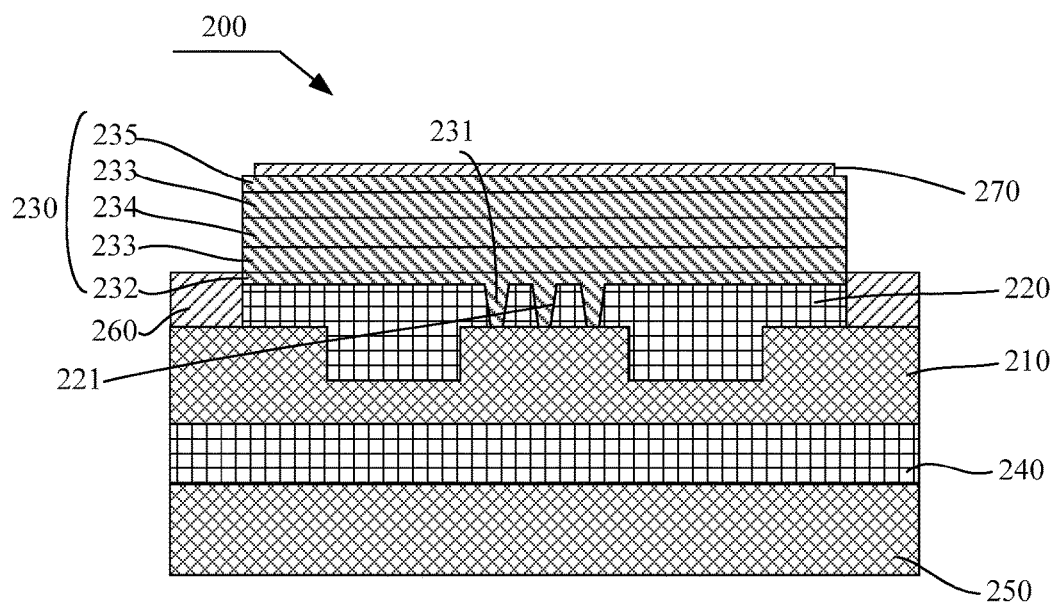
FIG. 10 is a schematic structural diagram of a laser according to another embodiment of the present disclosure.

FIG. 10 is a schematic structural diagram of a laser according to another embodiment of the present disclosure.

As shown in FIG. 10, in this embodiment, the semiconductor device 200 is a laser.

In this embodiment, the III-V semiconductor layer 230 constitutes a main structure of the laser, including a buffer layer 231, an active region 234, an interlayer 233, an N-type doped transition layer 232, and a P-type doped transition layer 235.

The III-V semiconductor material in the window 221 forms the buffer layer 231, and the semiconductor material in the buffer layer 231 has no threading dislocations.

Light of the laser is generated and amplified in the active region 234. The active region 234 may include a multi-quantum well or a quantum dot, to improve an optical gain.

In this embodiment, the semiconductor device 200 further includes an N electrode 260 and a P electrode 270, where the N electrode 260 is connected to the N-type doped transition layer 232, and the P electrode 270 is connected to the P-type doped transition layer 235. Optionally, the semiconductor device 200 may further include a grating structure.

Light output from the main structure of the laser is coupled into the waveguide in the first silicon layer 210.

For the laser in this embodiment, a III-V semiconductor material is used to form a main structure of the laser, and the III-V semiconductor material has no threading dislocations; therefore, the laser has relatively high performance.

Figure 11:
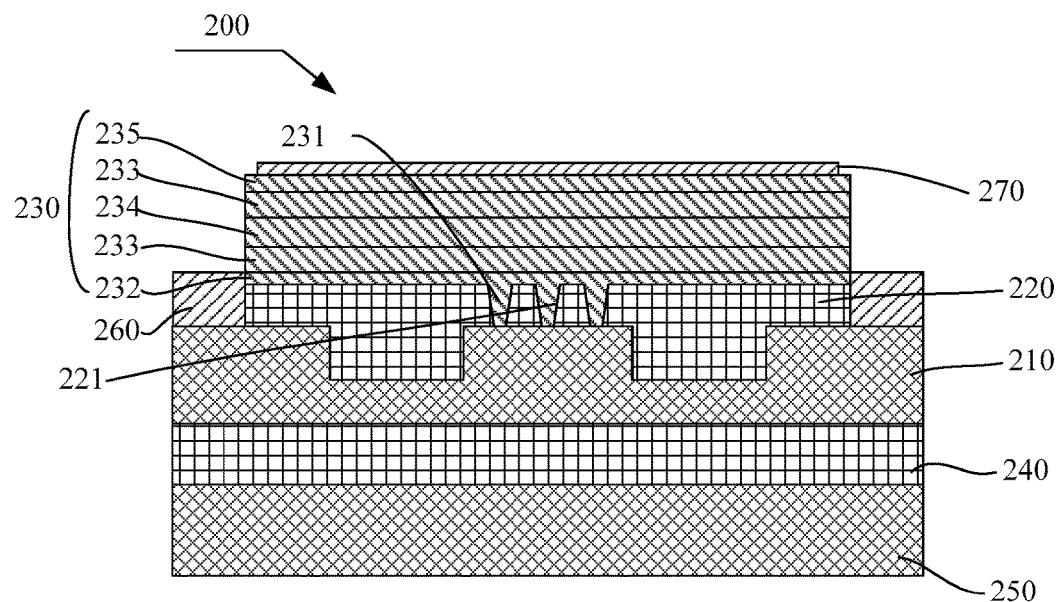
FIG. 11 is a schematic structural diagram of an optical amplifier according to another embodiment of the present disclosure.

FIG. 11 is a schematic structural diagram of an optical amplifier according to another embodiment of the present disclosure.

As shown in FIG. 11, in this embodiment, the semiconductor device 200 is an optical amplifier, which is also referred to as a SOA.

The III-V semiconductor layer 230 constitutes a main structure of the optical amplifier, including a buffer layer 231, an active region 234, an interlayer 233, an N-type doped transition layer 232, and a P-type doped transition layer 235.

The III-V semiconductor material in the window 221 forms the buffer layer 231, and the semiconductor material in the buffer layer 231 has no threading dislocations.

Light input into the optical amplifier from outside is amplified in the active region 234. The active region 234 may include a semiconductor material, a multi-quantum well, a quantum dot, a quantum wire, or the like.

In this embodiment, the semiconductor device 200 further includes an N electrode 260 and a P electrode 270. The N electrode 260 is connected to the N-type doped transition layer 232, and the P electrode 270 is connected to the P-type doped transition layer 235. The semiconductor device 200 further includes an antireflective film, located on an end face of the III-V semiconductor layer.

Light output from the main structure of the optical amplifier is coupled into the waveguide in the first silicon layer 210.

For the optical amplifier in this embodiment, a III-V semiconductor material is used to form a main structure of the optical amplifier, and the III-V semiconductor material has no threading dislocations; therefore, the optical amplifier has relatively high performance.

Figure 12:
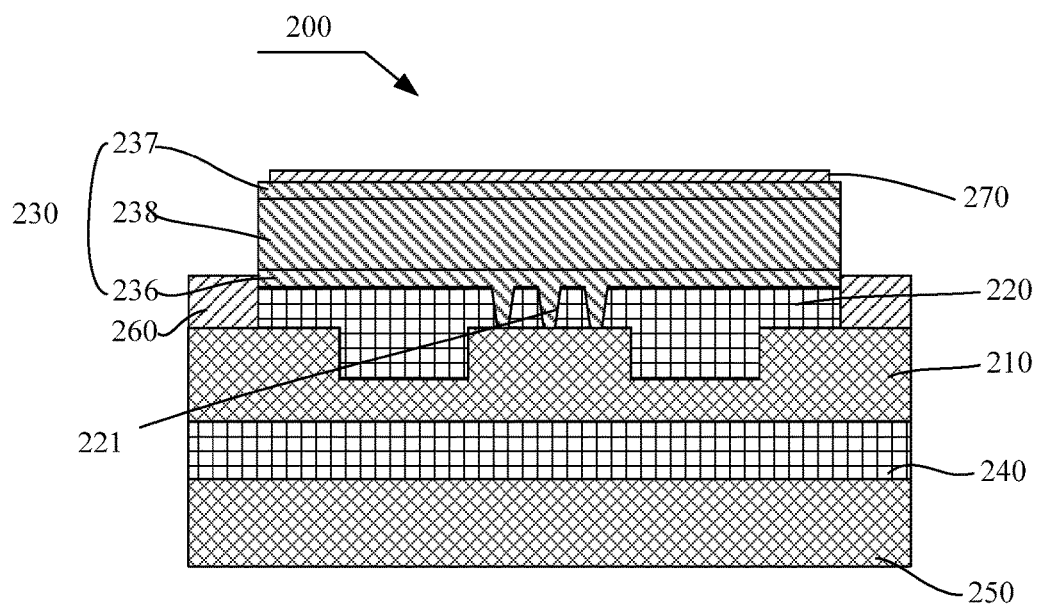
FIG. 12 is a schematic structural diagram of a detector according to another embodiment of the present disclosure.

FIG. 12 and FIG. 13 are schematic structural diagrams of a photodetector according to another embodiment of the present disclosure.

In this embodiment, the semiconductor device 200 is a photodetector.

As shown in FIG. 12 and FIG. 13, the III-V semiconductor layer 230 includes an N region 236, a P region 237, and an intrinsic region 238.

The N region 236 and the P region 237 are doped regions. The N region 236 and the P region 237 may be vertically distributed (as shown in FIG. 12), and may also be distributed on a device surface (as shown in FIG. 13).

The semiconductor device 200 further includes an N electrode 260 and a P electrode 270. The N electrode 260 is connected to the N region 236, and the P electrode 270 is connected to the P region 237.

Light is coupled into the detector from the waveguide in the first silicon layer 210 in order to be detected.

For the photodetector in this embodiment, a III-V semiconductor material is used, and the III-V semiconductor material has no threading dislocations; therefore, the photodetector has relatively high performance.

The foregoing describes in detail the semiconductor device in the embodiments of the present disclosure, and a method for producing a semiconductor device in an embodiment of the present disclosure is described in detail in the following.

FIG. 14 is a schematic flowchart of a method 300 for producing a semiconductor device according to an embodiment of the present disclosure. As shown in FIG. 14, the method 300 includes the following steps.

S310: Etch a silicon layer of SOI using a patterned template as a mask, where the SOI includes a silicon substrate, a dielectric layer on the silicon substrate, and the silicon layer on the dielectric layer; and when the dielectric layer is exposed, stop the etching and remove the patterned template so that the silicon layer has a window.

S320: Etch the dielectric layer using the silicon layer having the window as a template, and when the silicon substrate is exposed, stop the etching and remove the silicon layer having the window so that the dielectric layer has a window, where a bottom horizontal size of the window of the dielectric layer is not greater than 20 nm.

S330: Grow a semiconductor material in the window of the dielectric layer to form a buffer layer, and continue to grow the semiconductor material on the buffer layer to obtain a semiconductor layer.

Figure 15:
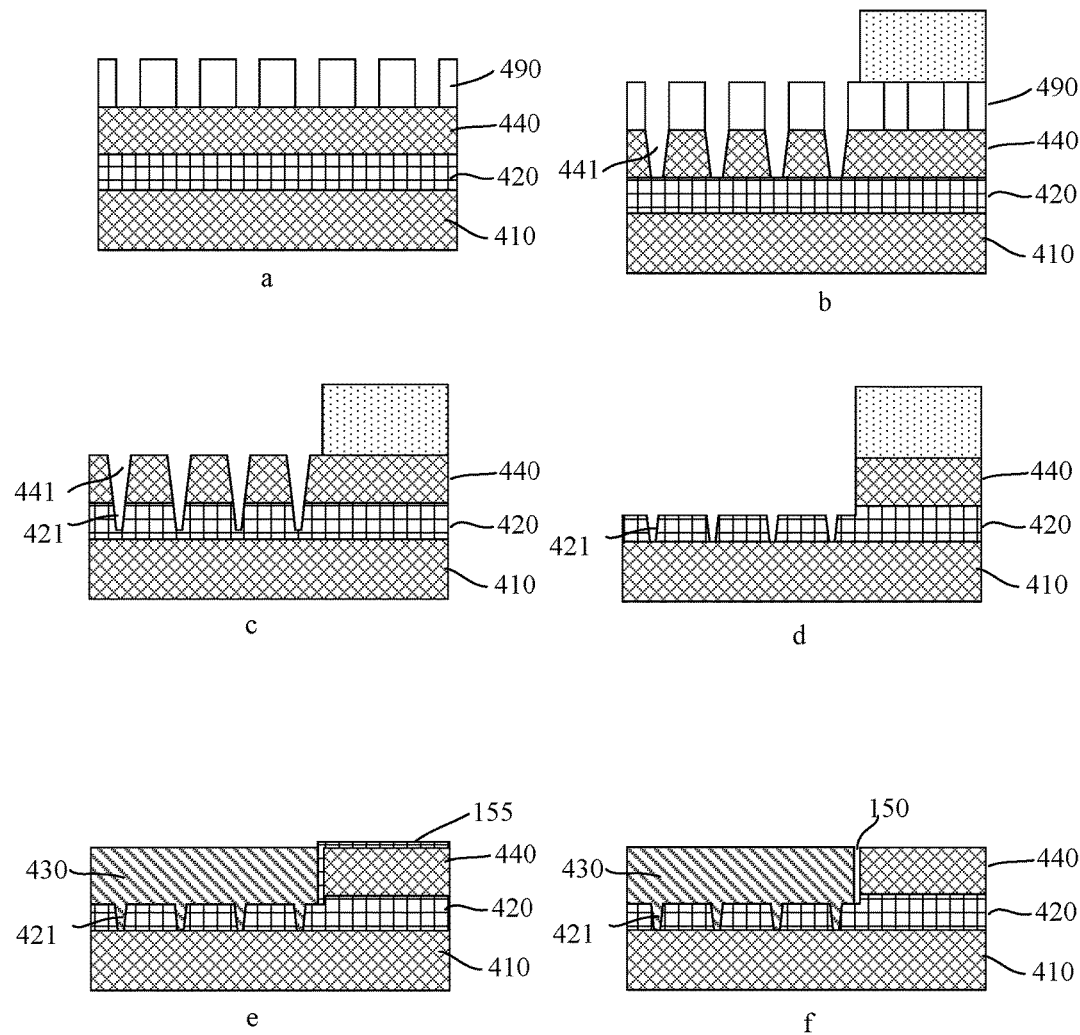
FIG. 15 is schematic diagrams of a semiconductor device at different stages in a method for producing a semiconductor device according to an embodiment of the present disclosure.

FIG. 15 is schematic diagrams of a semiconductor device at different stages in the method 300. As shown in FIG. 15, SOI includes a silicon substrate 410, a dielectric layer 420, and a silicon layer 440. Different thicknesses of the dielectric layer 420 and the silicon layer 440 may be selected according to different requirements and application of the device.

In S310, a patterned template 490 is used first to etch the silicon layer of the SOI.

Optionally, the patterned template 490 is a porous alumina membrane or a photoresist after exposure to extreme ultraviolet and development. If a porous alumina membrane is used, the porous alumina membrane is directly stuck on the silicon layer 440 of the SOI (as shown in figure a in FIG. 15). A thin oxide layer may be formed in advance on the silicon layer 440, facilitating subsequent removing of the porous alumina film. If a photoresist after exposure to extreme ultraviolet and development is used, the photoresist is first coated on the silicon layer 440, then a light source for extreme ultraviolet lithography is used to expose the photoresist, and the patterned template 490 is obtained after development.

Before etching, a partial region of the patterned template 490 may be sheltered using a photoresist (as shown in figure b in FIG. 15) so that the silicon layer under the sheltered region is not etched.

The silicon layer 440 may be selectively etched by controlling an etching parameter, without etching the dielectric layer 420 under the silicon layer 440. When the dielectric layer 420 is exposed, etching is stopped.

Because the patterned template 490 exerts a shadow effect on an etched beam current, a window 441 whose aperture is gradually reduced is formed in the silicon layer 440, that is, a top horizontal size of the window 441 is greater than a bottom horizontal size of the window 441 (as shown in figure b in FIG. 15).

Next, the patterned template 490 is removed, and a patterned silicon layer 440 having the window 441 is obtained. A removing method may be a chemical method.

In S320, the patterned silicon layer 440 having the window 441 is used as a template to etch the dielectric layer 420. A window 421 is formed in the dielectric layer 420 (as shown in figure c in FIG. 15). Because of the shadow effect, a bottom horizontal size of the window 421 is less than a top horizontal size of the window 421, that is, the bottom horizontal size of the window 421 of the dielectric layer 420 is quite less than a size of a window of the patterned template 490. Then the silicon layer that is not sheltered is removed (as shown in figure d in FIG. 15).

In S330, a semiconductor material is selectively grown in the window 421 of the dielectric layer 420 so that a buffer layer is formed first; then, the semiconductor material continues to be grown in the buffer layer so that a semiconductor layer 430 is obtained (as shown in figure e in FIG. 15).

Before growing the semiconductor material, a remaining part of the silicon layer 440 is protected first, for example, a medium protective layer 155 is formed using silicon oxide, silicon nitride, or the like.

Preferably, the semiconductor material is a III-V semiconductor material, which, for example, may be one or more of the following: aluminium phosphide (AlP), gallium phosphide (GaP), indium phosphide (InP), aluminium arsenide (AlAs), gallium arsenide (GaAs), indium arsenide (InAs), aluminium antimonide (AlSb), gallium antimonide (GaSb), indium antimonide (InSb), aluminium nitride (AlN), gallium nitride (GaN), indium nitride (InN), and ternary and quaternary compounds thereof.

Optionally, the growth method may include molecular beam epitaxy (MBE), chemical vapor deposition (CVD), atomic layer deposition (ALD), and variations thereof. For example, the CVD may include metal-organic chemical vapor deposition (MOCVD), plasma enhanced chemical vapor deposition (PECVD), low pressure chemical vapor deposition (LPCVD), ultra high vacuum chemical vapor deposition (UHVCVD), reactive plasma chemical vapor deposition (RPCVD), and the like.

Optionally, the semiconductor material may further include a preset quantity of doped materials, to form a PN or PIN structure. The grown semiconductor material may form an active region, where the active region may include a structure such as a multi-quantum well or a quantum dot.

Optionally, the method 300 further includes producing a waveguide in the silicon layer that is not etched.

As shown in figure f in FIG. 15, a waveguide is produced in the remaining part of the silicon layer 440. In addition, the medium protective layer 155 further needs to be removed, and a gap left behind needs to be filled, to form a filling layer 150. For example, a material such as amorphous silicon may be used to fill the gap.

Because a size of a window in a dielectric layer obtained using the method for producing a semiconductor device in this embodiment of the present disclosure is quite less than a size of a window of a patterned template, a relatively small window may be formed in the dielectric layer by controlling the size of the window of the patterned template in order to meet a condition for growing different III-V semiconductor materials without a threading dislocation. For example, a bottom horizontal size of the window formed in the dielectric layer is not greater than 20 nm, or may be less than 10 nm, or may be even less than 2 nm.

Because a window whose bottom horizontal size is not greater than 20 nm may be formed in a dielectric layer according to the method for producing a semiconductor device in this embodiment of the present disclosure, a III-V semiconductor material in a semiconductor device produced using the method for producing a semiconductor device in this embodiment of the present disclosure has no threading dislocations. Therefore, a semiconductor device with relatively high performance can be produced according to the method for producing a semiconductor device in this embodiment of the present disclosure.

According to the method 300 for producing a semiconductor device in this embodiment of the present disclosure, the semiconductor device 100 in the foregoing embodiment of the present disclosure can be produced, and furthermore, with reference to the specific structure of the laser, the optical amplifier, the photodetector, or the transistor provided in the foregoing embodiment, a corresponding semiconductor device can be produced.

Figure 16:
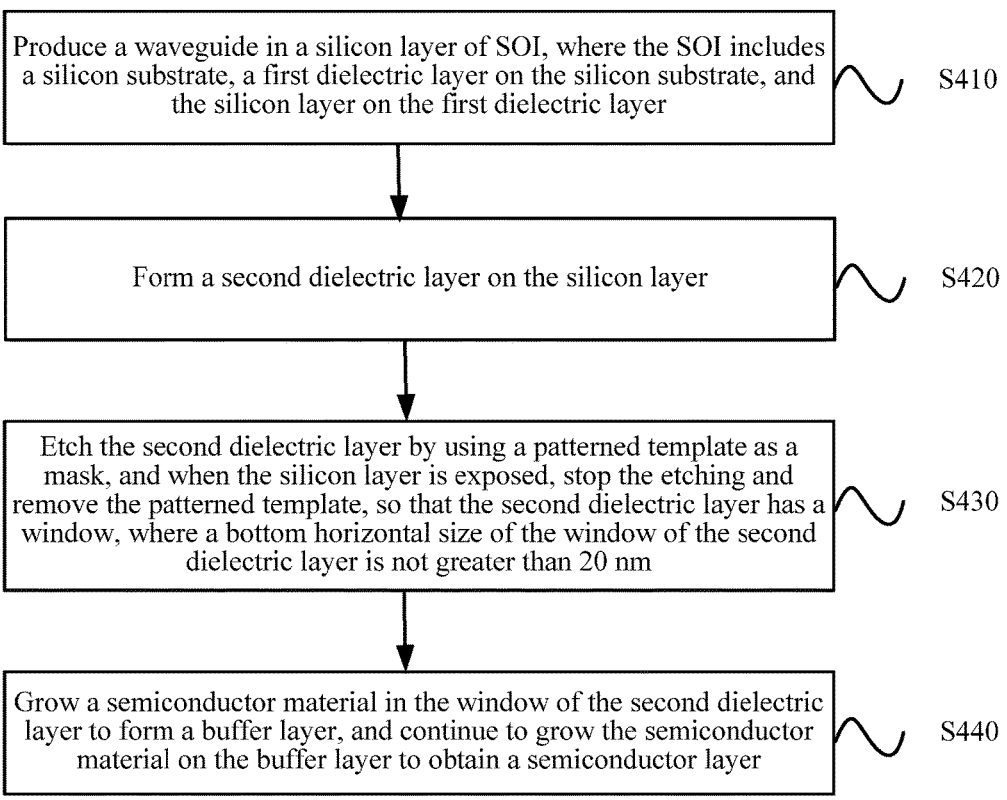
FIG. 16 is a schematic flowchart of a method for producing a semiconductor device according to another embodiment of the present disclosure.

FIG. 16 is a schematic flowchart of another method 400 for producing a semiconductor device according to another embodiment of the present disclosure. As shown in FIG. 16, the method 400 includes the following steps.

S410: Produce a waveguide in a silicon layer of SOI, where the SOI includes a silicon substrate, a first dielectric layer on the silicon substrate, and the silicon layer on the first dielectric layer.

S420: Form a second dielectric layer on the silicon layer.

S430: Etch the second dielectric layer using a patterned template as a mask, and when the silicon layer is exposed, stop the etching and remove the patterned template so that the second dielectric layer has a window, where a bottom horizontal size of the window of the second dielectric layer is not greater than 20 nm.

S440: Grow a semiconductor material in the window of the second dielectric layer to form a buffer layer, and continue to grow the semiconductor material on the buffer layer to obtain a semiconductor layer.

Figure 17:
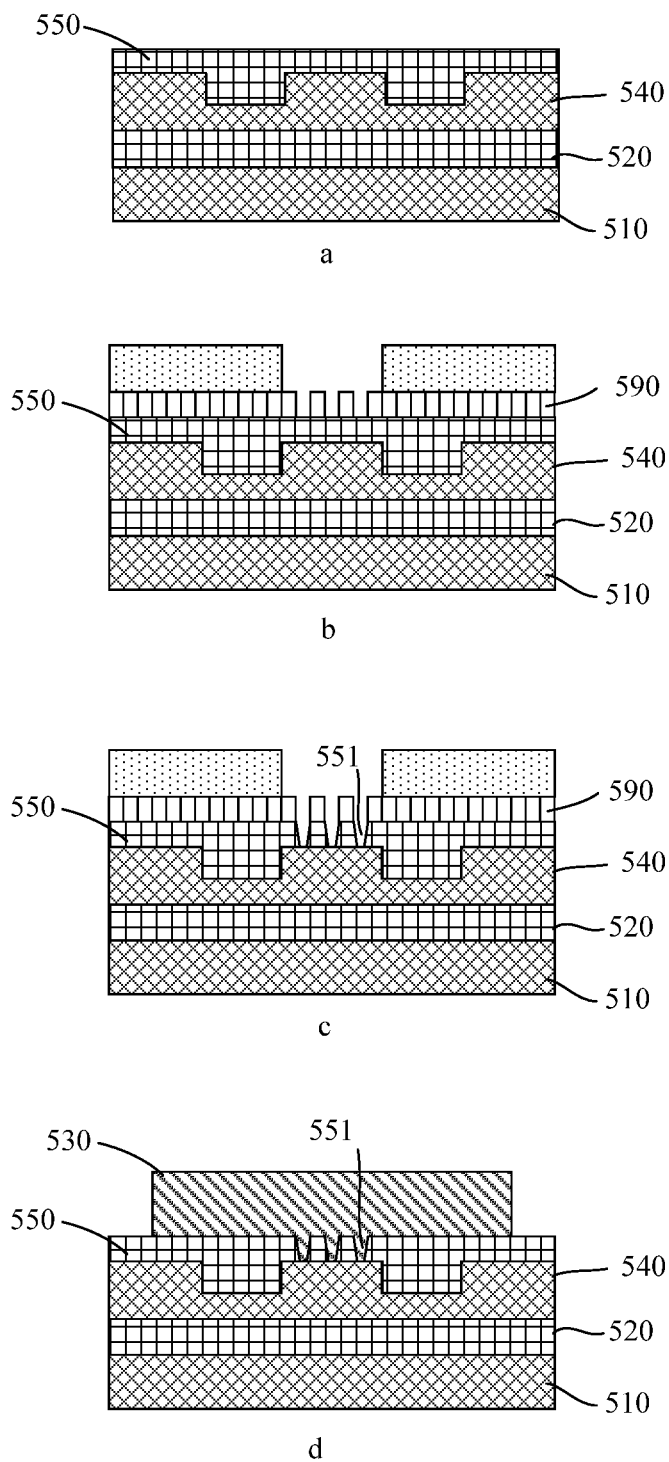
FIG. 17 is schematic diagrams of a semiconductor device at different stages in a method for producing a semiconductor device according to another embodiment of the present disclosure.

FIG. 17 is schematic diagrams of a semiconductor device at different stages in the method 400. As shown in FIG. 17, SOI includes a silicon substrate 510, a first dielectric layer 520, and a silicon layer 540.

In S410, a waveguide is produced in the silicon layer 540 of the SOI, for example, a ridge waveguide is produced, as shown in figure a in FIG. 17.

In S420, a second dielectric layer 550 is formed on the silicon layer 540 having the waveguide.

In S430, the second dielectric layer 550 is etched using a patterned template 590.

Optionally, the patterned template 590 is a porous alumina membrane or a photoresist after exposure to extreme ultraviolet and development. Before etching, a partial region of the patterned template 590 may be sheltered using a photoresist, where a region that is not sheltered by the photoresist corresponds to a position of the waveguide (as shown in figure b in FIG. 17).

The second dielectric layer 550 is etched, to expose the silicon layer 540, and form a window 551 on the second dielectric layer 550 (as shown in figure c in FIG. 17).

Because the patterned template 590 exerts a shadow effect on an etched beam current, a bottom horizontal size of the window 551 formed on the second dielectric layer 550 is less than a top horizontal size of the window 551. Therefore, a relatively small window may be formed in the second dielectric layer 550 by controlling a size of a window of the patterned template 590, for example, a window whose bottom horizontal size is not greater than 20 nm is formed.

Next, the photoresist and the patterned template 590 are removed.

In S440, a semiconductor material is selectively grown in the window 551 of the second dielectric layer 550 so that a buffer layer is formed first, and then the semiconductor material continues to be grown in the buffer layer so that a semiconductor layer 530 is obtained (as shown in figure d in FIG. 17).

Preferably, the semiconductor material is a III-V semiconductor material, which, for example, may be one or more of the following: aluminium phosphide (AlP), gallium phosphide (GaP), indium phosphide (InP), aluminium arsenide (AlAs), gallium arsenide (GaAs), indium arsenide (InAs), aluminium antimonide (AlSb), gallium antimonide (GaSb), indium antimonide (InSb), aluminium nitride (AlN), gallium nitride (GaN), indium nitride (InN), and ternary and quaternary compounds thereof.

Optionally, the semiconductor material may further include a preset quantity of doped materials.

Because a window whose bottom horizontal size is not greater than 20 nm may be formed in a dielectric layer according to the method for producing a semiconductor device in this embodiment of the present disclosure, a III-V semiconductor material in a semiconductor device produced using the method for producing a semiconductor device in this embodiment of the present disclosure has no threading dislocations. Therefore, a semiconductor device with relatively high performance can be produced according to the method for producing a semiconductor device in this embodiment of the present disclosure.

According to the method 400 for producing a semiconductor device in this embodiment of the present disclosure, the semiconductor device 200 in the foregoing embodiment of the present disclosure can be produced, and furthermore, with reference to the specific structure of the laser, the optical amplifier, the photodetector, or the transistor provided in the foregoing embodiment, a corresponding semiconductor device can be produced.

It should be understood that sequence numbers of the foregoing processes do not mean execution sequences in various embodiments of the present disclosure. The execution sequences of the processes should be determined according to functions and internal logic of the processes, and should not be construed as any limitation on the implementation processes of the embodiments of the present disclosure.

A person of ordinary skill in the art may be aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in an embodiment of implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments of the present disclosure.

In addition, functional units in the embodiments of the present disclosure may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present disclosure essentially, or the part contributing to the prior art, or all or a part of the technical solutions may be implemented in the form of a software product. The software product is stored in a storage medium and includes several instructions for instructing a computer device (which may be a personal computer, a server, or a network device) to perform all or a part of the steps of the methods described in the embodiments of the present disclosure. The foregoing storage medium includes any medium that can store program code, such as a universal serial bus (USB) flash drive, a removable hard disk, a read-only memory (ROM), a random access memory (RAM), a magnetic disk, or an optical disc.

The foregoing descriptions are merely specific embodiments of the present disclosure, but are not intended to limit the protection scope of the present disclosure. Any modification or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A method for producing a semiconductor device, comprising:
    etching a silicon layer of silicon on insulator (SOI) using a patterned template as a mask, the SOI comprising a silicon substrate, a dielectric layer on the silicon substrate, and the silicon layer on the dielectric layer, a first window of the silicon layer being etched to expose the dielectric layer, and a bottom horizontal size of the first window being less than a top horizontal size of the first window;
    etching the dielectric layer using the silicon layer having the first window as a template, a second window of the dielectric layer being etched to expose the silicon substrate, the second window of the dielectric layer being shaped to limit a size of contact surface exposed over the silicon substrate, and a bottom horizontal size of the second window being less than a top horizontal size of the second windows; and
    growing a semiconductor material in the second window of the dielectric layer to form a buffer layer, the semiconductor material being further grown on the buffer layer to obtain a semiconductor layer, the limited size of the contact surface to reduce threading dislocations of the semiconductor material within the second window of the dielectric layer, the size of the contact surface being based on the bottom horizontal size of the second window of the dielectric layer, and the bottom horizontal size of the second window not being grater than twenty nanometers (nm).

2. The method of claim 1, wherein the semiconductor material is a III-V semiconductor material.

3. The method of claim 1, further comprising sheltering a partial region of the patterned template using a photoresist so that the silicon layer under the sheltered region is not etched.

4. The method of claim 3, further comprising producing a waveguide in the silicon layer that is not etched.

5. A non-transitory computer readable medium, comprising computer program code, which, when executed by a computer unit, will cause the computer unit to:
    etch a silicon layer of silicon on insulator (SOI) using a patterned template as a mask, the SOI comprising a silicon substrate, a dielectric layer on the silicon substrate, and the silicon layer on the dielectric layer, a first window of the silicon layer being etched to expose the dielectric layer, and a bottom horizontal size of the first window being less than a top horizontal size of the first window;
    etch the dielectric layer using the silicon layer having the first window as a template, a second window of the dielectric layer being etched to expose the silicon substrate, the window of the dielectric layer being shaped to limit a size of contact surface exposed over the silicon substrate, and a bottom horizontal size of the second window being less than a top horizontal size of the second window; and
    grow a semiconductor material in the second window of the dielectric layer to form a buffer layer, the semiconductor material being further grown on the buffer layer to obtain a semiconductor layer, the limited size of the contact surface to reduce threading dislocations of the semiconductor material within the second window of the dielectric layer, the size of the contact surface being based on the bottom horizontal size of the second window of the dielectric layer, and the bottom horizontal size of the second window not being greater than twenty nanometers (nm).

6. The computer readable medium of the claim 5, the computer program code further causing the computer unit to shelter a partial region of the patterned template using a photoresist so that the silicon layer under the sheltered region is not etched.

7. The computer readable medium of the claim 6, the computer program code further causing the computer unit to produce a waveguide in the silicon layer that is not etched.

* * * * *